United States Patent
Matsumura (10) Patent No.: US 8,218,311 B2
(45) Date of Patent: Jul. 10, 2012

(54) ELECTRONIC APPARATUS

(75) Inventor: Kazuyuki Matsumura, Shizuoka (JP)

(73) Assignee: Toshiba Tec Kabushiki Kaisha, Tokyo (JP)

( * ) Notice: Subject to any disclaimer, the term of this patent is extended or adjusted under 35 U.S.C. 154(b) by 120 days.

(21) Appl. No.: 12/835,185

(22) Filed: Jul. 13, 2010

(65) Prior Publication Data

US 2011/0019359 A1    Jan. 27, 2011

(30) Foreign Application Priority Data

Jul. 23, 2009    (JP) ................. 2009-172399

(51) Int. Cl.
G06F 1/20 (2006.01)
H05K 7/20 (2006.01)

(52) U.S. Cl. ......... 361/679.47; 361/679.52; 361/679.54; 361/700; 361/704; 361/709; 361/715; 165/80.2; 165/185

(58) Field of Classification Search .......... 361/679.46–679.47, 679.52, 679.54, 361/688–689, 700, 702, 704, 707, 709–710, 361/715; 165/80.2–80.3, 185
See application file for complete search history.

(56) References Cited

U.S. PATENT DOCUMENTS

| | | | | |
|---|---|---|---|---|
| 6,445,580 | B1 * | 9/2002 | Cohen et al. | 361/679.47 |
| 6,560,104 | B2 * | 5/2003 | DeHoff et al. | 361/679.52 |
| 6,643,132 | B2 * | 11/2003 | Faneuf et al. | 361/700 |
| 6,657,121 | B2 * | 12/2003 | Garner | 174/16.3 |
| 6,693,797 | B2 * | 2/2004 | Faneuf et al. | 361/689 |
| 6,776,221 | B2 * | 8/2004 | Montgomery et al. | 165/46 |
| 6,796,372 | B2 * | 9/2004 | Bear | 165/104.21 |
| 6,829,142 | B2 * | 12/2004 | Belady et al. | 361/679.47 |
| 6,836,407 | B2 * | 12/2004 | Faneuf et al. | 361/679.49 |
| 6,972,365 | B2 * | 12/2005 | Garner | 174/16.3 |
| 7,012,807 | B2 * | 3/2006 | Chu et al. | 361/699 |
| 7,071,408 | B2 * | 7/2006 | Garner | 174/16.3 |
| 7,133,283 | B2 * | 11/2006 | Faneuf et al. | 361/689 |
| 7,233,491 | B2 * | 6/2007 | Faneuf et al. | 361/689 |
| 7,403,384 | B2 * | 7/2008 | Pflueger | 361/688 |
| 7,539,020 | B2 * | 5/2009 | Chow et al. | 361/726 |
| 7,551,438 | B2 * | 6/2009 | Seki | 361/699 |
| 7,839,640 | B2 * | 11/2010 | Hayashi et al. | 361/699 |
| 7,957,132 | B2 * | 6/2011 | Fried | 361/679.47 |
| 2006/0187639 | A1 * | 8/2006 | Carswell | 361/699 |
| 2008/0013283 | A1 * | 1/2008 | Gilbert et al. | 361/715 |

FOREIGN PATENT DOCUMENTS

| | | |
|---|---|---|
| JP | 57-159287 | 10/1982 |
| JP | 03-246997 | 11/1991 |
| JP | 5-52560 | 7/1993 |
| JP | 7-29898 | 6/1995 |
| JP | 2001-156483 | 6/2001 |
| JP | 2009-123231 | 6/2009 |

OTHER PUBLICATIONS

Japanese Office Action for Application No. 2009-172399 mailed on Apr. 12, 2011.

* cited by examiner

*Primary Examiner* — Robert J Hoffberg
(74) *Attorney, Agent, or Firm* — Turocy & Watson, LLP (57) ABSTRACT

According to one embodiment, a heat radiation block is pressed in contact with a heat receiving plate of an apparatus body, a heat receiving block receives its reaction force via a heat pipe and thus moves. A drawer section and the heat radiation block are fixed and held in the apparatus body after the movement of the heat receiving block.

10 Claims, 7 Drawing Sheets

ELECTRONIC APPARATUS

CROSS-REFERENCE TO RELATED APPLICATION

This application is based upon and claims the benefit of priority from Japanese Patent Application No. 2009-172399, filed Jul. 23, 2009; the entire contents of which are incorporated herein by reference.

FIELD

Embodiments described herein relate generally to an electronic apparatus having a cooling structure to cool a heat generating electronic component, for example, a CPU (central processing unit) or the like.

BACKGROUND

An electronic apparatus, for example, an electronic apparatus used as a POS (point of sales) terminal has a CPU for control within the apparatus body. However, this CPU tends to increase power consumption and the quantity of heat generation.

Thus, conventionally, a cooling fan is used to cool the CPU.

However, if the cooling fan is used, there is a problem of poor durability and large noise.

Thus, recently, an apparatus is developed in which heat generated in the CPU is transferred using a heat pipe so as to cool the CPU, for example, as disclosed in JP-UM-A-5-52560.

In the electronic apparatus using the heat pipe, a drawer section is provided which enters and exits the apparatus body from the front side, and the CPU is installed in this drawer section. For maintenance of the CPU, the drawer section is pulled out of the apparatus body and the CPU can be thus situated outside.

Meanwhile, the heat pipe has its one end side fixed to the CPU via a heat receiving block. A heat radiation block is provided on the other end side. The back side of the apparatus body is formed by a heat receiving plate (heat receiving surface section) that is made of, for example, an aluminum alloy.

As the drawer section is inserted into the apparatus body, the heat radiation block is pressed in contact with the heat receiving plate (heat receiving surface section) on the back side of the apparatus body. Thus, heat generated in the CPU is transferred from the one end side of the heat pipe toward the other end side. The transferred heat is radiated outside via the heat radiation block and the heat receiving plate. Thus, the CPU is cooled.

However, the heat receiving block, the heat pipe, the heat radiation block, the heat receiving plate and the like have a processing variation (for example, approximately 2 mm). Therefore, at the time of assembly, even if one tries to insert the drawer section into the apparatus body and thus press the heat radiation block in contact with the heat receiving plate of the apparatus body, a variation occurs in contact pressure.

Therefore, since the heat radiation block cannot be pressed in contact with the heat receiving plate of the apparatus body with an appropriate pressure, there is a problem that a sufficient cooling effect cannot be achieved.

Thus, an electronic apparatus is demanded in which the processing variation of components is absorbed so that the heat radiation block can be pressed in contact with the heat receiving surface section of the apparatus body with an appropriate pressure.

DETAILED DESCRIPTION

In general, according to one embodiment, an apparatus body; a drawer section which is inserted into the apparatus body in a manner that allows free entry and exit; a heat generating electronic component provided in the drawer section; a heat receiving block which is superimposed on the heat generating electronic component; a heat pipe which has its one end side fixed to the heat receiving block; a heat radiation block which is fixed to the other end side of the heat pipe and situated on an insertion end side of the drawer section; a supporting device which movably supports the heat receiving block along the direction of entry and exit of the drawer section; and a heat receiving surface section which forms a part of the apparatus body and which the heat radiation block is pressed in contact with, as the drawer section is inserted into the apparatus body. As the heat radiation block is pressed in contact with the heat receiving surface section of the apparatus body, the heat receiving block receives its reaction force via the heat pipe and thus moves. The drawer section and the heat radiation block are fixed and held in the apparatus body after the movement of the heat receiving block.

Hereinafter, an embodiment of the invention will be described with reference to the drawings.

Figure 1:
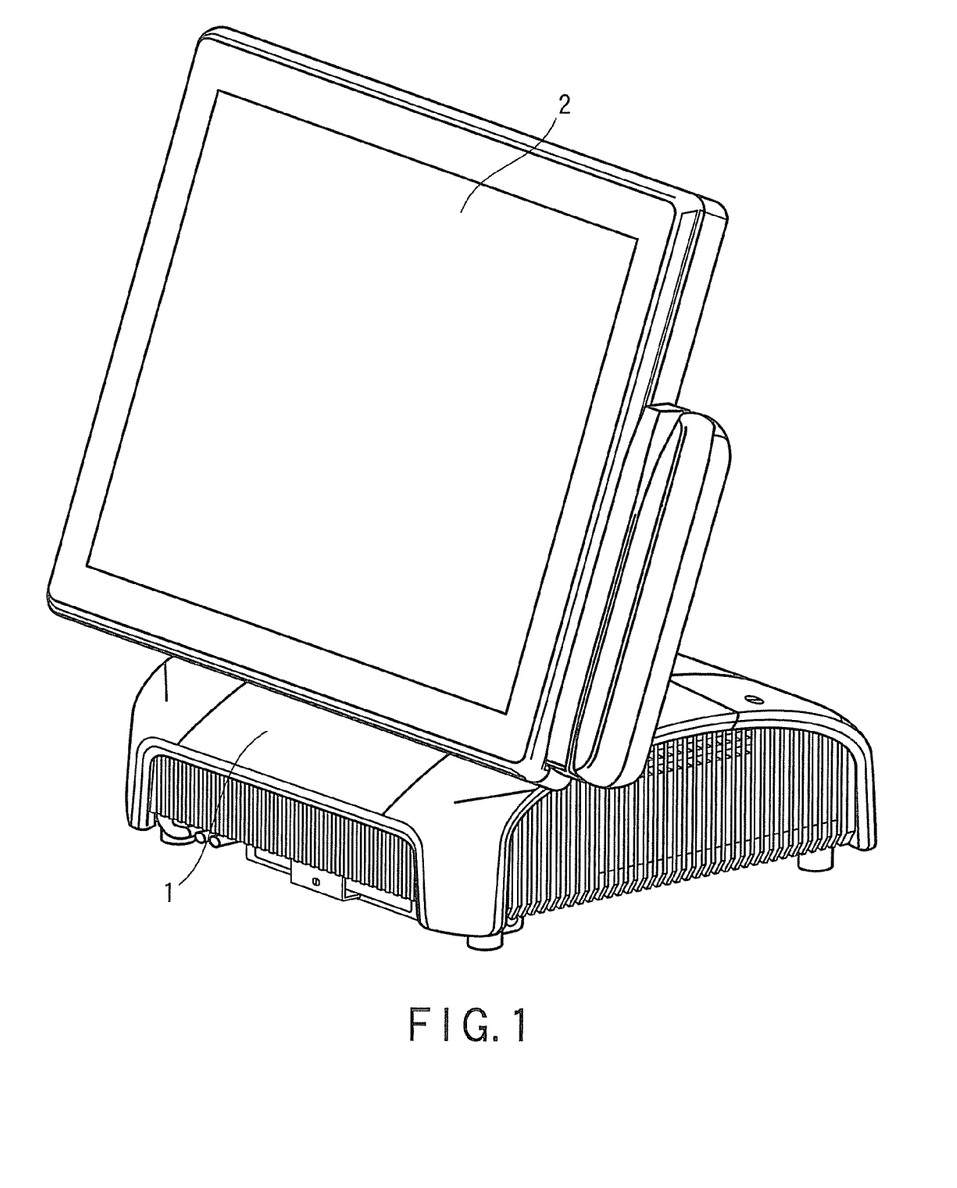
FIG. 1 is a perspective view showing an electronic apparatus as an embodiment of the invention.
Figure 2:
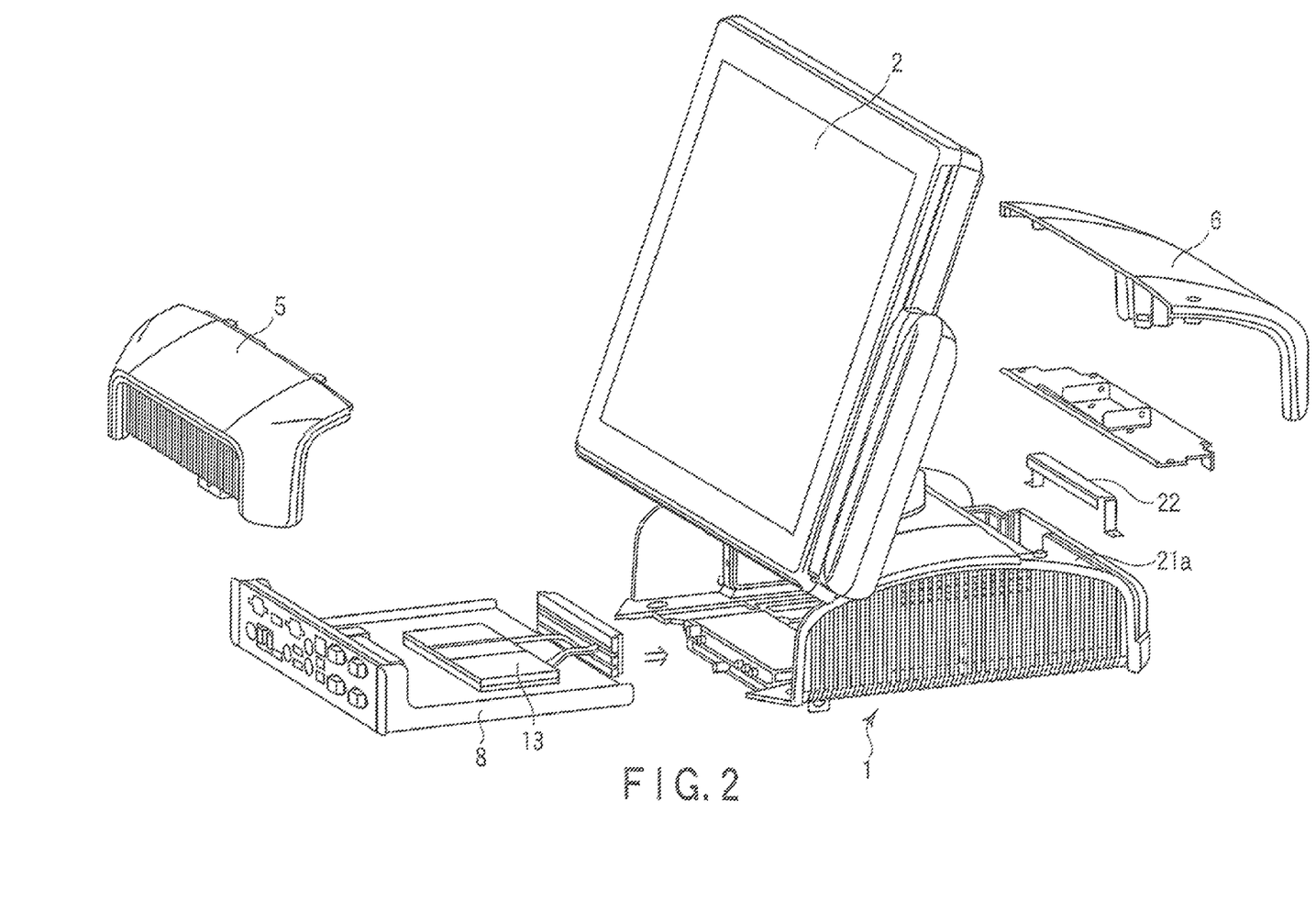
FIG. 2 is a partly exploded perspective view showing the electronic apparatus shown in FIG. 1.
Figure 3:
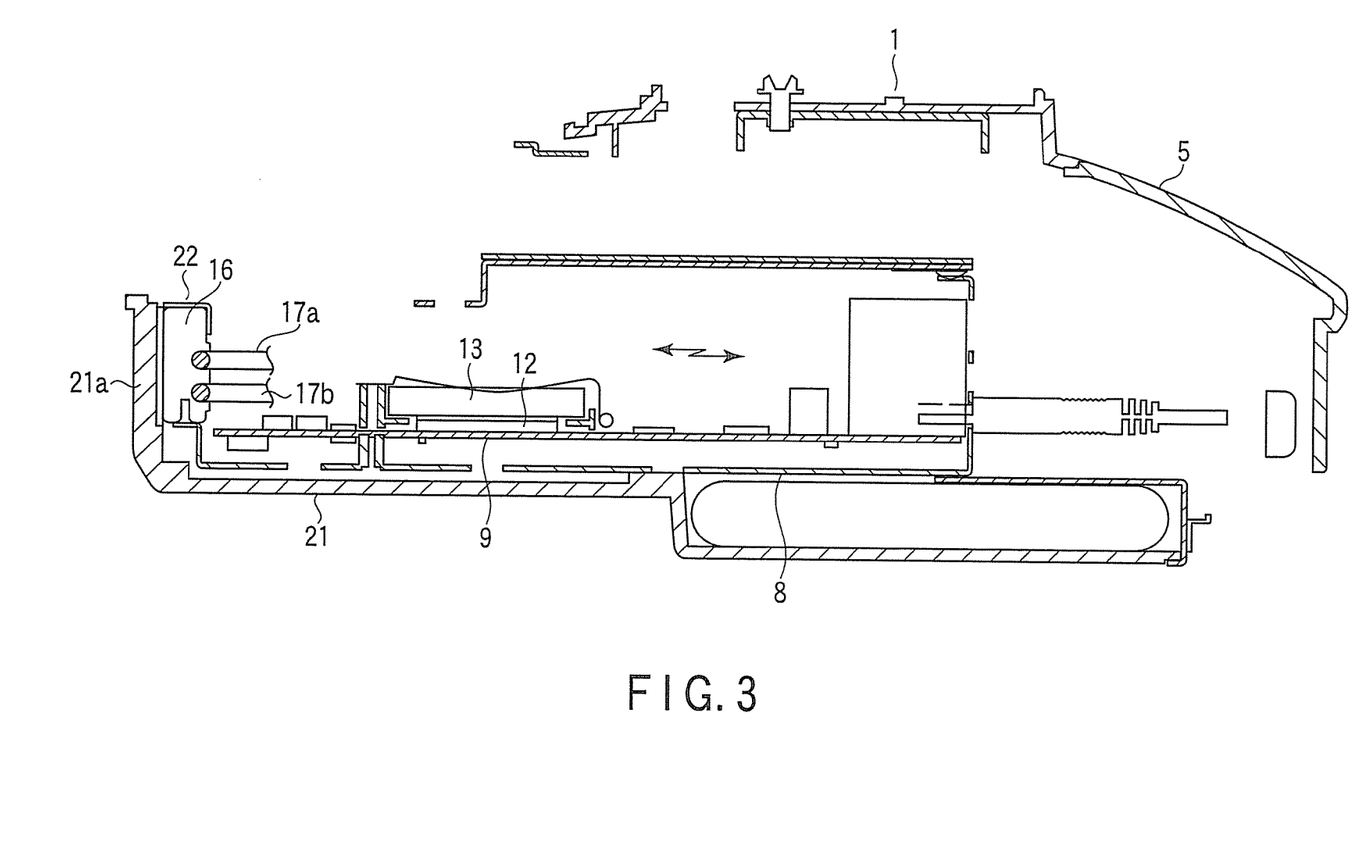
FIG. 3 shows the inner configuration of the apparatus body shown in FIG. 1.

FIG. 1 is a perspective view showing an electronic apparatus which is used, for example, as a POS terminal. FIG. 2 is its exploded perspective view. FIG. 3 shows its inner configuration.

The electronic apparatus has an apparatus body 1. A display 2 with a touch panel is provided on top of the apparatus body 1.

As shown in FIG. 2, the front side of the apparatus body 1 is opened and closed by a front cover 5. The rear side is opened and closed by a rear cover 6.

In the apparatus body 1, a drawer section 8 is inserted from the front side in a manner that allows free entry and exit, as shown in FIG. 3.

Figure 4:
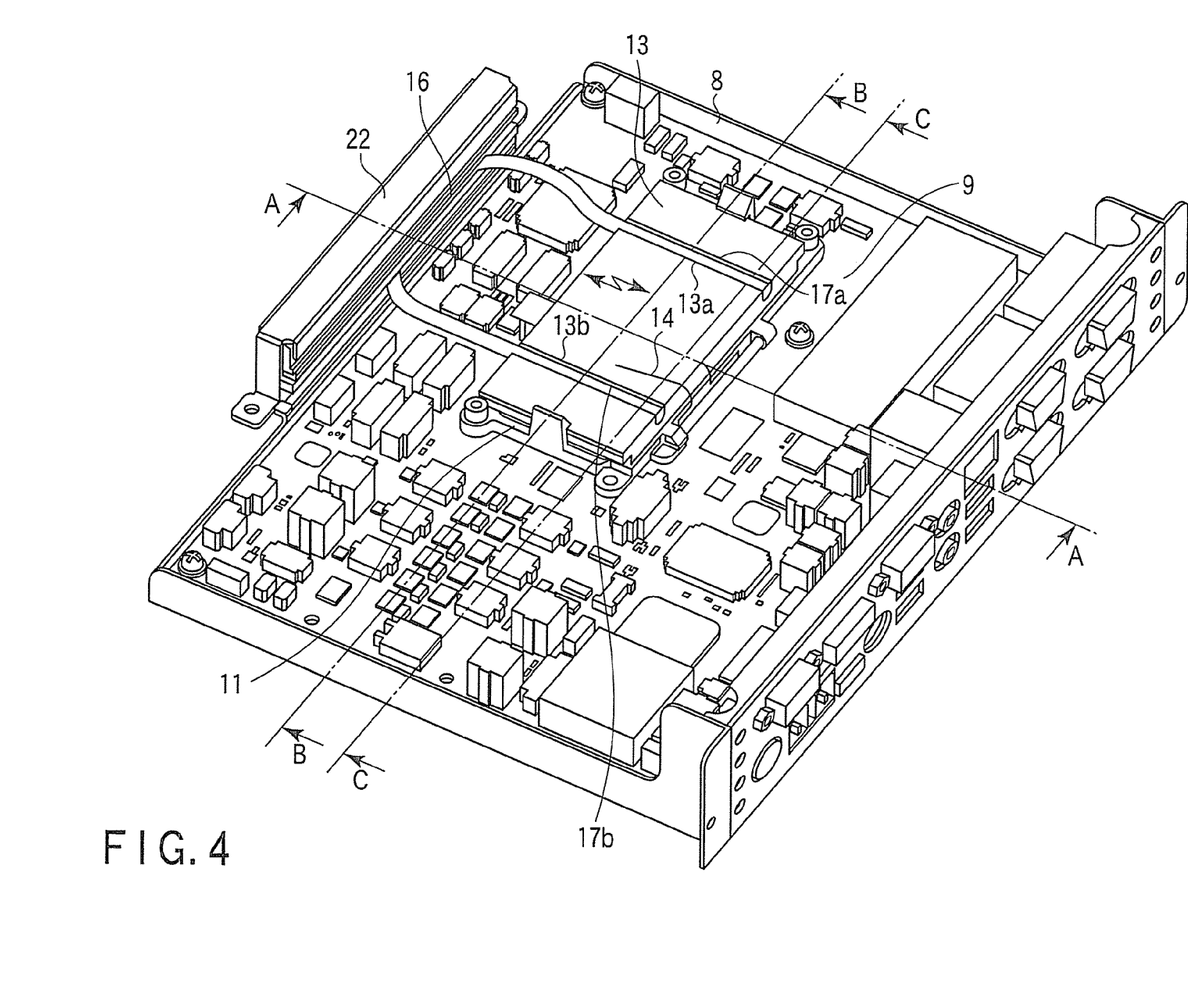
FIG. 4 is a perspective view showing a drawer section that is inserted into the apparatus body shown in FIG. 3.
Figure 5:
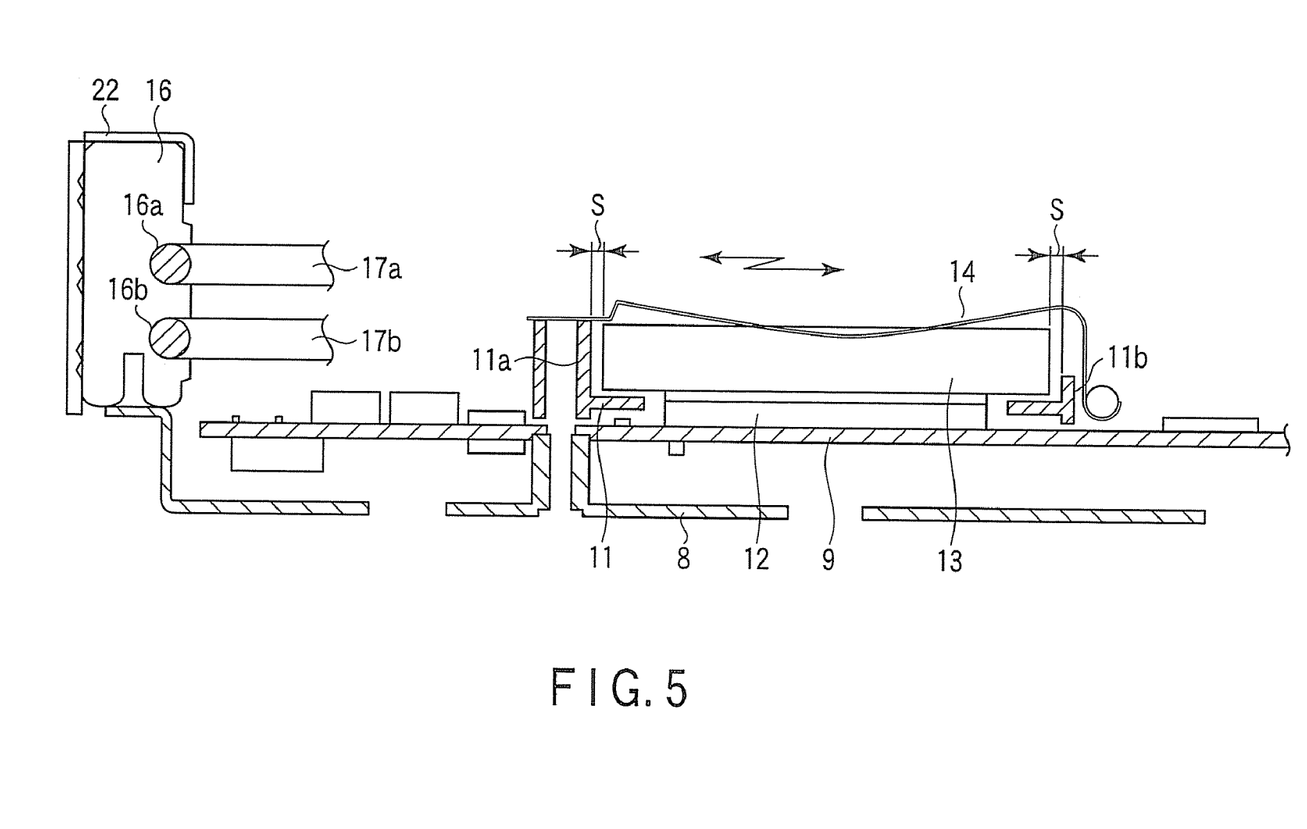
FIG. 5 is a sectional view along line A-A in FIG. 4.
Figure 6:
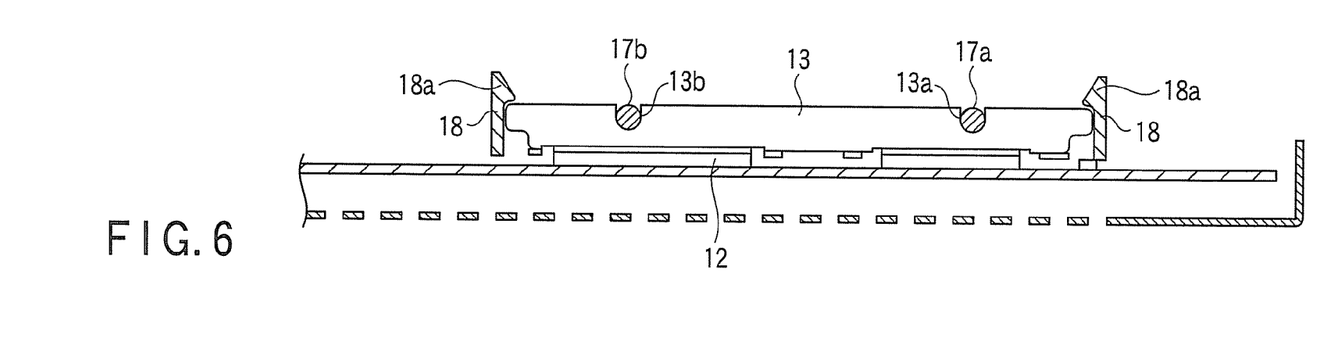
FIG. 6 is a sectional view along line B-B in FIG. 4.
Figure 7:
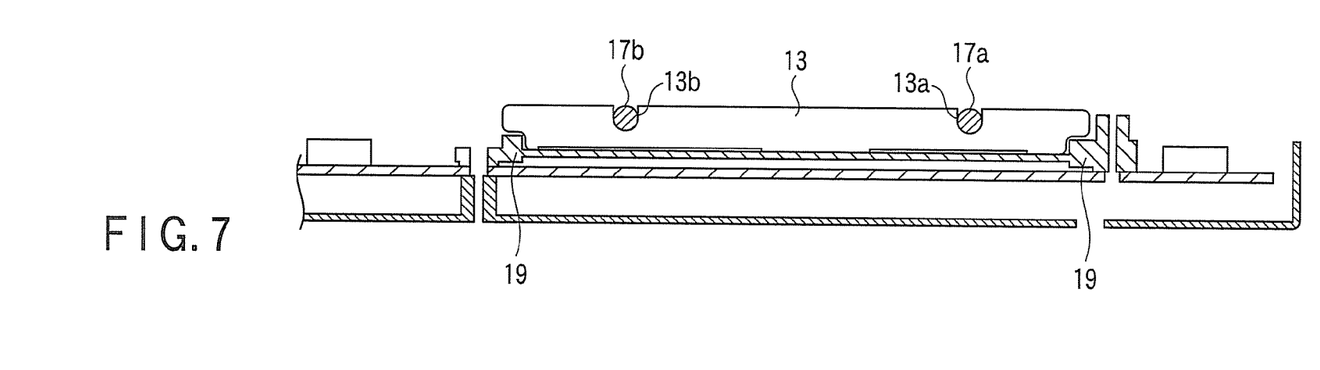
FIG. 7 is a sectional view along line C-C in FIG. 4.

FIG. 4 is a perspective view showing the drawer section 8. FIG. 5 is a sectional view along line A-A in FIG. 4. FIG. 6 is a sectional view along line B-B in FIG. 4. FIG. 7 is a sectional view along line C-C in FIG. 4.

A mother board 9 is provided on top of the drawer 8. On the mother board 9, a CPU 12 as a heat generating electronic component is installed. A heat receiving block 13 made of an aluminum alloy is superimposed on top of the CPU 12. In an upper part of the heat receiving block 13, two grooves 13a and 13b are formed parallel to each other with a predetermined space between them and along the direction of entry and exit of the drawer section 8. One end sides of heat pipes 17a and 17b are fitted and fixed in these grooves 13a and 13b. The other end sides of the heat pipes 17a and 17b are extended toward the rear and their extended ends are bent substantially 90 degrees. A heat radiation block 16 made of an aluminum alloy is attached to the bent parts of the heat pipes 17a and 17b. That is, in a wall surface of the heat radiation block 16, two grooves 16a and 16b are formed parallel to each other with a predetermined vertical space between them. The bent parts of the heat pipes 17a and 17b are fitted and fixed in the two grooves 16a and 16b.

The heat receiving block 13 fixed to the one end sides of the heat pipes 17a and 17b is supported by a supporting device 11 in a manner that allows sliding along the back-and-forth direction, that is, the direction of entry and exit of the drawer section 8, as shown in an arrow of FIGS. 4 and 5.

The supporting device 11 has regulating walls 11a and 11b that face the front side and the rear side of the heat receiving block 13, respectively, with a gap S. The heat receiving block 13 can slide in the back-and-forth direction by the amount of the gap S.

On the supporting device 11, a spring member 14 is provided which elastically presses and holds the heat receiving block 13 on top of the CPU 12.

Moreover, first elastic holding springs 18 are provided on the supporting device 11, as a holding section which elastically presses and holds the top half side of both lateral sections of the heat receiving block 13 along the direction of its movement, as shown in FIG. 6. Second elastic holding springs 19 are provided on the supporting device 11, as a holding section which elastically presses and holds the bottom half side of both lateral sections of the heat receiving block 13, as shown in FIG. 7.

As the heat receiving block 13 receives a force in the back-and-force direction, the heat receiving block 13 can slide in the back-and-forth direction by the amount of the gap S against the holding force of the first elastic holding springs 18 and the second elastic holding springs 19.

Pawl parts 18a are formed at upper ends of the first elastic holding springs 18. The pawl parts 18a are engaged with top corners of the heat receiving block 13. This engagement regulates popping up of the CPU 12.

Figure 8:
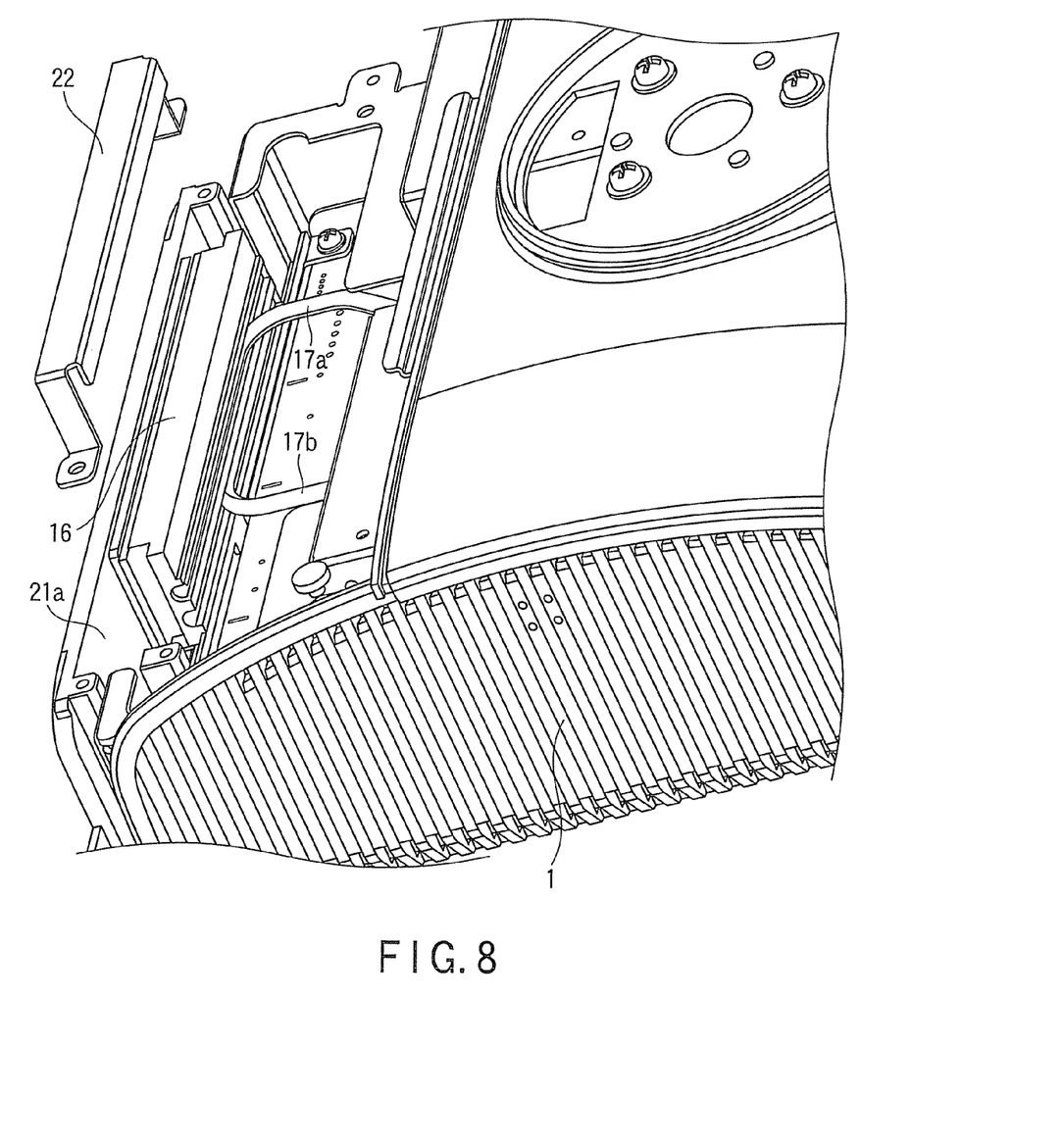
FIG. 8 is an enlarged perspective view showing the state where a heat radiation block of a heat pump is pressed in contact with a heat receiving plate of a bottom cover of the apparatus body shown in FIG. 3.

Meanwhile, the back side of a bottom cover 21 forming the inner bottom part of the apparatus body 1 is formed by a heat receiving plate (heat receiving surface section) 21a made of an aluminum alloy, as shown in FIG. 2, FIG. 3 and FIG. 8.

When the drawer section 8 is inserted into the apparatus body 1, the heat radiation block 16 on the heat pipes 17a and 17b that is situated on the insertion end side, is pressed in contact with the heat receiving plate 21a of the bottom cover 21.

In the above-described configuration, heat generated in the CPU 12 is transferred from the one end to the other end via the heat receiving block 13 and the heat pipes 17a and 17b and then radiated outside via the heat radiation block 16 and the heat receiving plate 21a of the bottom cover 21 which the heat radiation block 16 is pressed in contact with. Thus, the CPU 12 is cooled.

Next, the assembly of the electronic apparatus will be described.

First, the drawer section 8 in the state shown in FIG. 2 is inserted into the apparatus body 1. As the drawer section 8 is inserted and the heat radiation block 16 situated on the insertion end side of the drawer section 8 is thus pressed in contact with the heat receiving plate 21a of the bottom cover 21 of the apparatus body 1 as shown in FIG. 3 and FIG. 8, the reaction force is transmitted to the heat receiving block 13 via the heat pipes 17a and 17b. Thus, the heat receiving block 13 is slid opposite to the direction of insertion, against the holding force of the first and second holding springs 18 and 19. As the heat receiving block 13 is slid, the processing variation of the heat receiving block 13, the heat pipes 17a and 17b, the heat radiation block 16, the heat receiving plate 21a and the like is absorbed. Since the variation is absorbed, the heat radiation block 16 on the heat pipes 17a and 17b is pressed in contact with the heat receiving plate 21a of the bottom cover 21 with an appropriate pressure.

If the heat receiving block 13 is provided in a fixed manner, the processing variation of the heat receiving block 13, the heat pipes 17a and 17b, the heat radiation block 16 and the heat receiving plate 21a may cause a variation in the press-contact force of the heat radiation block 16 to the heat receiving plate 21a of the bottom cover 21 and a sufficient cooling effect may not be achieved.

After the heat radiation block 16 is pressed in contact with the heat receiving plate 21a of the bottom cover 21, the front side of the drawer section 8 is fixed to the apparatus body 1 with a screw (not shown) and the heat radiation block 16 is fixed to the back side of the apparatus body 1 with a metal fitting 22 as a fixing member. After that, the front cover 5 is attached to the apparatus body 1 to close the aperture and the rear cover 6 is attached to the apparatus body 1. The assembly thus ends.

In the case of carrying out maintenance of the CPU 12, the front cover 5 is detached and then the screw on the drawer section 8 is removed and the drawer section 8 is pulled out. The CPU 12 is thus situated outside and the maintenance work is carried out.

As described above, according to the embodiment, as the drawer section 8 is inserted into the apparatus body 1 and the heat radiation block 16 is pressed in contact with the heat receiving plate 21a of the bottom cover 21 of the apparatus body 1, the heat radiation block 16 is slid opposite to the direction of insertion of the drawer section 8 via the heat pipes 17a and 17b. Therefore, the processing variation of the heat receiving block 13, the heat pipes 17a and 17b, the heat radiation block 16, the heat receiving block 21a and the like can be absorbed.

Thus, the heat radiation block 16 can be pressed in contact with the heat receiving plate 21a of the bottom cover 21 with an appropriate pressure and the CPU 12 can be cooled sufficiently.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. An electronic apparatus comprising:
an apparatus body;
a drawer section which is inserted into the apparatus body in a manner that allows free entry and exit;
a heat generating electronic component provided in the drawer section;
a heat receiving block which is superimposed on the heat generating electronic component;
a heat pipe which has its one end side fixed to the heat receiving block;

a heat radiation block which is fixed to the other end side of the heat pipe and situated on an insertion end side of the drawer section;

a supporting device which movably supports the heat receiving block along the direction of entry and exit of the drawer section; and a heat receiving surface section which forms a part of the apparatus body and which the heat radiation block is pressed in contact with, as the drawer section is inserted into the apparatus body;

wherein as the heat radiation block is pressed in contact with the heat receiving surface section of the apparatus body, the heat receiving block receives its reaction force via the heat pipe and thus moves; and the drawer section and the heat radiation block are fixed and held in the apparatus body after the movement of the heat receiving block.

2. The apparatus of claim 1, wherein the supporting device has a regulating wall which regulates a quantity of movement of the heat receiving block to a predetermined quantity.

3. The apparatus of claim 1, further comprising a holding section which is provided in the supporting device and elastically presses and holds both lateral sections of the heat receiving block along the direction of its movement.

4. The apparatus of claim 3, wherein the holding section has a first holding spring which holds a top half side of both lateral sections of the heat receiving block, and a second holding spring which holds a bottom half side.

5. The apparatus of claim 4, wherein the first holding spring has a pawl part which is engaged with and holds a top part of the heat receiving block.

6. The apparatus of claim 1, further comprising a spring member which is provided in the supporting device and elastically presses and holds a top part of the heat receiving block.

7. The apparatus of claim 1, wherein the one end side of the heat pipe is fitted and fixed in a groove formed in a top part of the heat receiving block.

8. The apparatus of claim 1, wherein the other end side of the heat pipe is fitted and fixed in a groove formed in a wall surface of the heat radiation block.

9. The apparatus of claim 1, wherein the heat generating electronic component is a CPU for control.

10. The apparatus of claim 1, wherein the heat receiving surface section of the apparatus body is formed by a heat receiving plate made of an aluminum alloy.

* * * * *